United States Patent
Fukushima et al.

(10) Patent No.: US 11,038,038 B2
(45) Date of Patent: Jun. 15, 2021

(54) TRANSISTORS AND METHODS OF FORMING TRANSISTORS

(71) Applicant: Micron Technology, Inc., Boise, ID (US)

(72) Inventors: Yoichi Fukushima, Hiroshima (JP); Takuya Imamoto, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/539,172

(22) Filed: Aug. 13, 2019

(65) Prior Publication Data

US 2021/0050428 A1 Feb. 18, 2021

(51) Int. Cl.
| | |
|---|---|
| *H01L 21/311* | (2006.01) |
| *H01L 29/66* | (2006.01) |
| *H01L 29/78* | (2006.01) |
| *H01L 29/40* | (2006.01) |
| *H01L 27/108* | (2006.01) |

(52) U.S. Cl.
CPC .... *H01L 29/6653* (2013.01); *H01L 27/10805* (2013.01); *H01L 29/401* (2013.01); *H01L 29/6656* (2013.01); *H01L 29/6659* (2013.01); *H01L 29/7833* (2013.01)

(58) Field of Classification Search
CPC ............ H01L 29/6653; H01L 29/6656; H01L 29/0649; H01L 29/4491; H01L 21/7982; H01L 2221/1042; H01L 21/7682; H01L 27/10805; H01L 29/0669; H01L 29/401; H01L 29/66568; H01L 29/6659; H01L 29/7833
See application file for complete search history.

(56) References Cited

U.S. PATENT DOCUMENTS

| | | | | |
|---|---|---|---|---|
| 5,914,519 | A * | 6/1999 | Chou | H01L 29/4983 257/408 |
| 6,127,711 | A | 10/2000 | Ono | |
| 9,252,233 | B2 * | 2/2016 | Hsiao | H01L 29/4991 |
| 2018/0233398 | A1 * | 8/2018 | Van Cleemput | H01L 21/31122 |
| 2019/0296123 | A1 * | 9/2019 | Lee | H01L 21/02167 |
| 2020/0219989 | A1 * | 7/2020 | Cheng | H01L 29/515 |

FOREIGN PATENT DOCUMENTS

| | | |
|---|---|---|
| JP | H07193233 | 7/1995 |
| JP | H1117166 | 1/1999 |

* cited by examiner

*Primary Examiner* — David C Spalla
(74) *Attorney, Agent, or Firm* — Wells St. John P.S.

(57) ABSTRACT

Some embodiments include a transistor having a gate, with the gate being over a semiconductor base. The gate has sidewalls. A channel region is under the gate. Spacers are along the sidewalk. The spacers each include a spacer structure and a void between the spacer structure and the gate. The spacer structures each include a vertical segment extending upwardly from a horizontal segment. The vertical segments join to the horizontal segments at corners. Source/drain regions are adjacent the channel region. The voids may be along the entirety of the vertical segments of the spacer structures, and may extend around the corners and to under the horizontal segments of the spacer structures. Additionally, or alternatively, bottoms of the voids may be adjacent fill material which includes silicon, nitrogen, boron and oxygen. Some embodiments include methods of forming transistors.

38 Claims, 17 Drawing Sheets

US 11,038,038 B2

TRANSISTORS AND METHODS OF FORMING TRANSISTORS

TECHNICAL FIELD

Transistors and methods of forming transistors. Integrated assemblies comprising transistors, such as, for example, memory arrays.

BACKGROUND

A continuing goal of integrated circuit fabrication is to achieve ever-higher levels of integration, and a related goal is to scale integrated devices to ever-decreasing dimensions. Transistors are example components of integrated circuitry, and may be incorporated into memory, logic, sensors, etc. For instance, transistors may be utilized as access devices of integrated memory, such as, for example DRAM (dynamic random-access memory).

A field effect transistor (FET) is an example transistor. The FET will generally have a gate provided proximate a channel region, and will have a pair of source/drain regions which are spaced from one another by the channel region. In operation, sufficient voltage applied to the gate will induce an electric field which enables current flow through the channel region to thereby electrically couple the source/drain regions to one another. If the voltage to the gate is below a threshold level, the current will not flow through the channel region, and the source/drain regions will not be electrically coupled with one another. The selective control of the coupling/decoupling of the source/drain regions through the level of voltage applied to the gate may be referred to as gated coupling of the source/drain regions.

A problem which may be encountered as transistors are scaled to decreasing dimensions is that there may be parasitic capacitance between the gate and one or both of the source/drain regions. Such parasitic capacitance may detrimentally reduce the overall speed of the transistors.

It would be desirable to develop new transistor configurations which have reduced problematic parasitic capacitance as compared to conventional configurations, and to develop methods of forming the new transistor configurations.

DETAILED DESCRIPTION OF THE ILLUSTRATED EMBODIMENTS

Some embodiments include transistor configurations having voids adjacent sidewalls of transistor gates. The voids may correspond to low-dielectric-constant regions between the gates and source/drain regions proximate the gates. The low-dielectric-constant regions may alleviate the problematic parasitic capacitance described above in the "Background" section. In some embodiments, the voids may be formed by removing a sacrificial material comprising silicon, boron, nitrogen and oxygen. Such sacrificial material may be selectively removed relative to silicon nitride. In some embodiments, some of the material comprising silicon, boron, nitrogen and oxygen may remain in a finished transistor. Example embodiments are described with reference to FIGS. 1-14.

Figure 1:
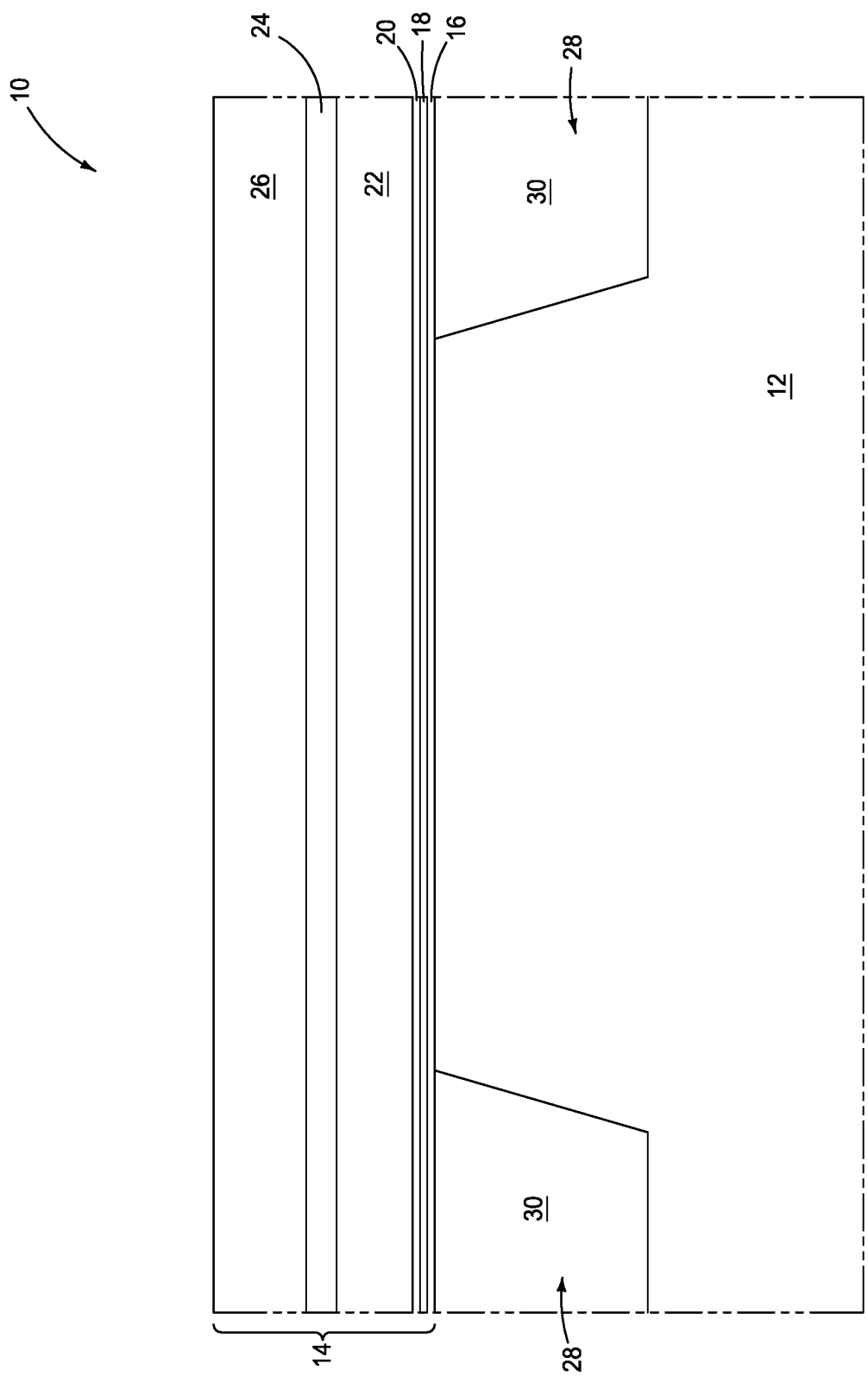
FIGS. 1-10 are diagrammatic cross-sectional views of a region of an integrated assembly at example sequential process stages of an example method for forming an example transistor.

Referring to FIG. 1, an integrated assembly 10 is shown at a preliminary process stage of an example method for forming example transistors. The assembly 10 includes a stack 14 formed over a substrate 12.

The stack 14 includes insulative materials 16 and 18, and includes conductive materials 20, 22 and 24.

The insulative materials 16 and 18 may be considered to be gate dielectric materials. Although the stack 14 is shown to comprise two gate dielectric materials, in other embodiments the stack may comprise more than two gate dielectric materials, or may comprise only a single gate dielectric material. The stack 14 may be generally referred to as comprising one or more gate dielectric materials.

The insulative materials 16 and 18 may comprise any suitable composition(s). In some embodiments, the material 16 may comprise, consist essentially of, or consist of one or both of silicon dioxide and silicon oxynitride. In some embodiments, the material 18 may comprise, consist essentially of, or consist of one or more high-k materials, such as, for example, hafnium oxide, hafnium silicate, lanthanum oxide, aluminum oxide, etc., (where the term high-k means a dielectric constant greater than that of silicon dioxide).

The conductive materials 20, 22 and 24 may be considered to be conductive gate materials. Although the stack 14 is shown to comprise three conductive gate materials, in other embodiments the stack may comprise more than three conductive gate materials, or less than three conductive gate materials. The stack 14 may be generally referred to as comprising one or more conductive gate materials.

The conductive gate materials 20, 22 and 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In some embodiments, the conductive material 20 may comprise, consist essentially of, or consist of one or more of TiAlN (titanium aluminum nitride), TaN (tantalum nitride) and TiN (titanium nitride), where the chemical formulas indicate primary constituents rather than specific stoichiometries.

In some embodiments, the conductive material 22 may comprise, consist essentially of, or consist of conductively-doped semiconductor material (e.g., conductively-doped polycrystalline silicon, conductively-doped amorphous silicon, etc.).

In some embodiments, the conductive material 24 may comprise, consist essentially of, or consist of tungsten.

In some embodiments, the material 20 may be considered to be a thin layer of metal-containing material provided at an interface between the conductive material 22 and the high-k dielectric material 18, and the stack 14 may be utilized to form a high-k metal gate (HKMG) transistor.

The stack 14 comprises a capping material 26 over the conductive material 24. The capping material 26 may comprise any suitable composition(s); and in some embodiments may comprise, consist essentially of, or consist of silicon nitride.

The various materials of the stack 14 may be formed with any suitable methods; including, for example, one or more of atomic layer deposition (ALD), chemical vapor deposition (CVD), physical vapor deposition (PVD), etc.

The substrate 12 may comprise semiconductor material; and may, for example, comprise, consist essentially of, or consist of monocrystalline silicon. The substrate 12 may be referred to as a semiconductor substrate or as a semiconductor base. The terms "semiconductor substrate" and "semiconductor base" mean any construction comprising semiconductive material, including, but not limited to, bulk semiconductive materials such as a semiconductive wafer (either alone or in assemblies comprising other materials), and semiconductive material layers (either alone or in assemblies comprising other materials). The terms "substrate" and "base" refer to any supporting structure, including, but not limited to, the semiconductor substrates described above. In some applications, the substrate 12 may correspond to a semiconductor substrate containing one or more materials associated with integrated circuit fabrication. Such materials may include, for example, one or more of refractory metal materials, barrier materials, diffusion materials, insulator materials, etc.

In the shown embodiment, isolation regions 28 extend into the base 12. The isolation regions may comprise any suitable configuration, and in some embodiments may correspond to shallow trench isolation (STI). The isolation regions 28 comprise insulative material 30, and in some embodiments such insulative material may comprise, consist essentially of, or consist of one or both of silicon dioxide and silicon nitride. For instance, the isolation regions 28 may comprise silicon dioxide, and may comprise a liner of silicon nitride between the silicon dioxide and the base 12.

Figure 2:
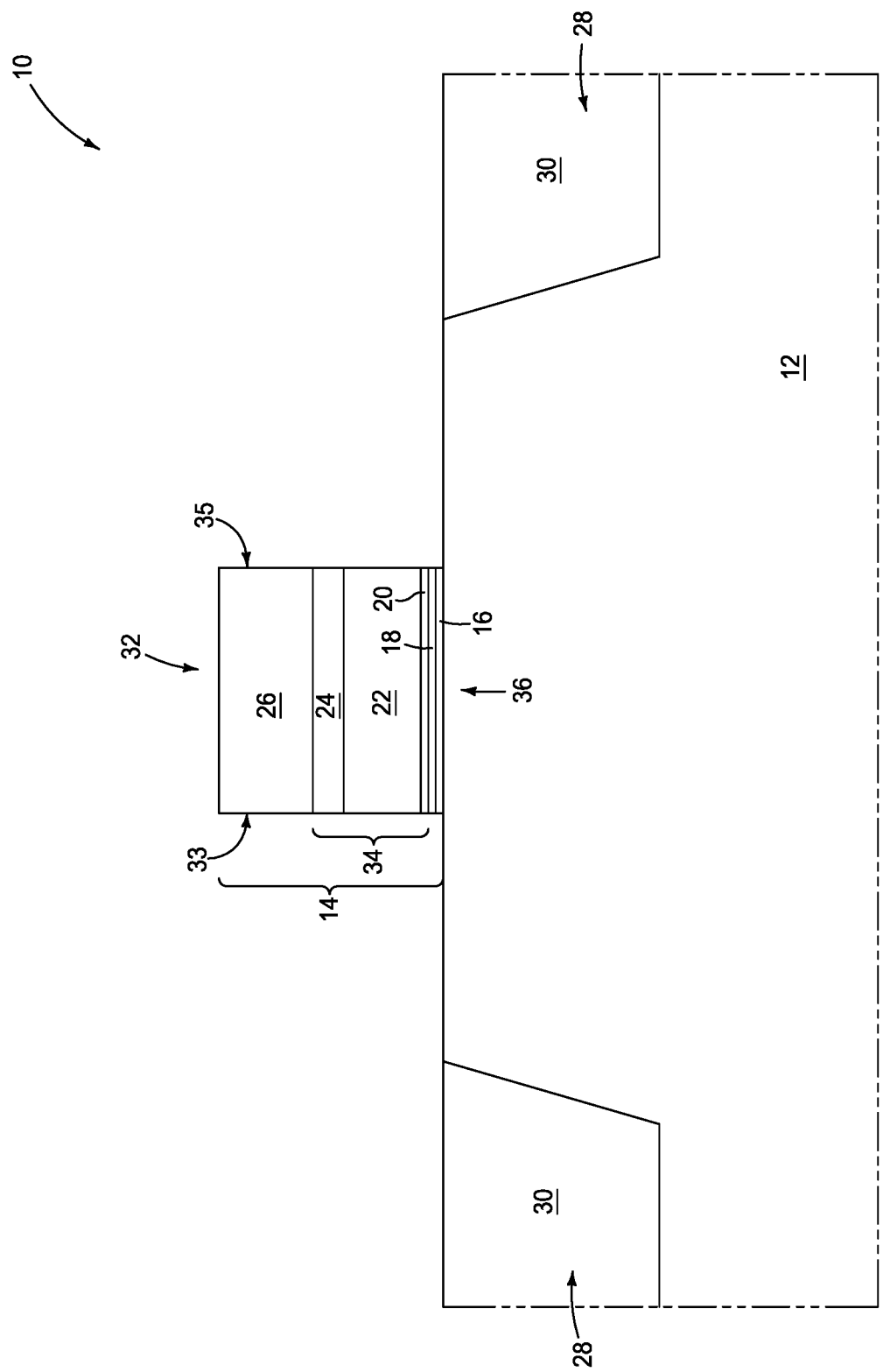

Referring to FIG. 2, the stack 14 is patterned into a block 32. The conductive gate materials 20, 22 and 24 of the block 32 may be considered to comprise a gate material block 34. The gate material block 34 may be considered to be a subcomponent (or substructure) of the block 32.

The block 32 may be patterned utilizing any suitable processing. In some embodiments, a photolithographically-patterned photoresist mask (not shown) may be formed over the stack 14 and utilized to define a location of the block 32, then one or more etches may be utilized to pattern the block 32 from the stack 14, and then the mask may be removed to leave the illustrated configuration of FIG. 2.

In the shown embodiment, the dielectric materials 16 and 18 are patterned during formation of the block 32. In other embodiments (not shown), one or more of the dielectric materials 16 and 18 may not be patterned into the block 32, and may instead remain in the configuration of FIG. 1 after the formation of the block 32. In such embodiments, the one or more dielectric materials which are not patterned into the block 32 may extend laterally outward beyond the patterned materials of the block 32 at the process stage of FIG. 2.

The block 32 comprises a pair of opposing sidewalk 33 and 35 along the cross-section of FIG. 2. The sidewalk 33 and 35 may be referred to as a first sidewall and a second sidewall, respectively. The sidewall 33 and 35 extend along the gate material block 34, as well as along the capping material 26; and in the shown embodiment also extend along both of the dielectric materials 16 and 18.

A transistor channel region 36 is under the block 32. The transistor channel region 36 is a region of the base 12 which may be influenced by an electric field induced through voltage applied to the gate material block 34.

Figure 3:
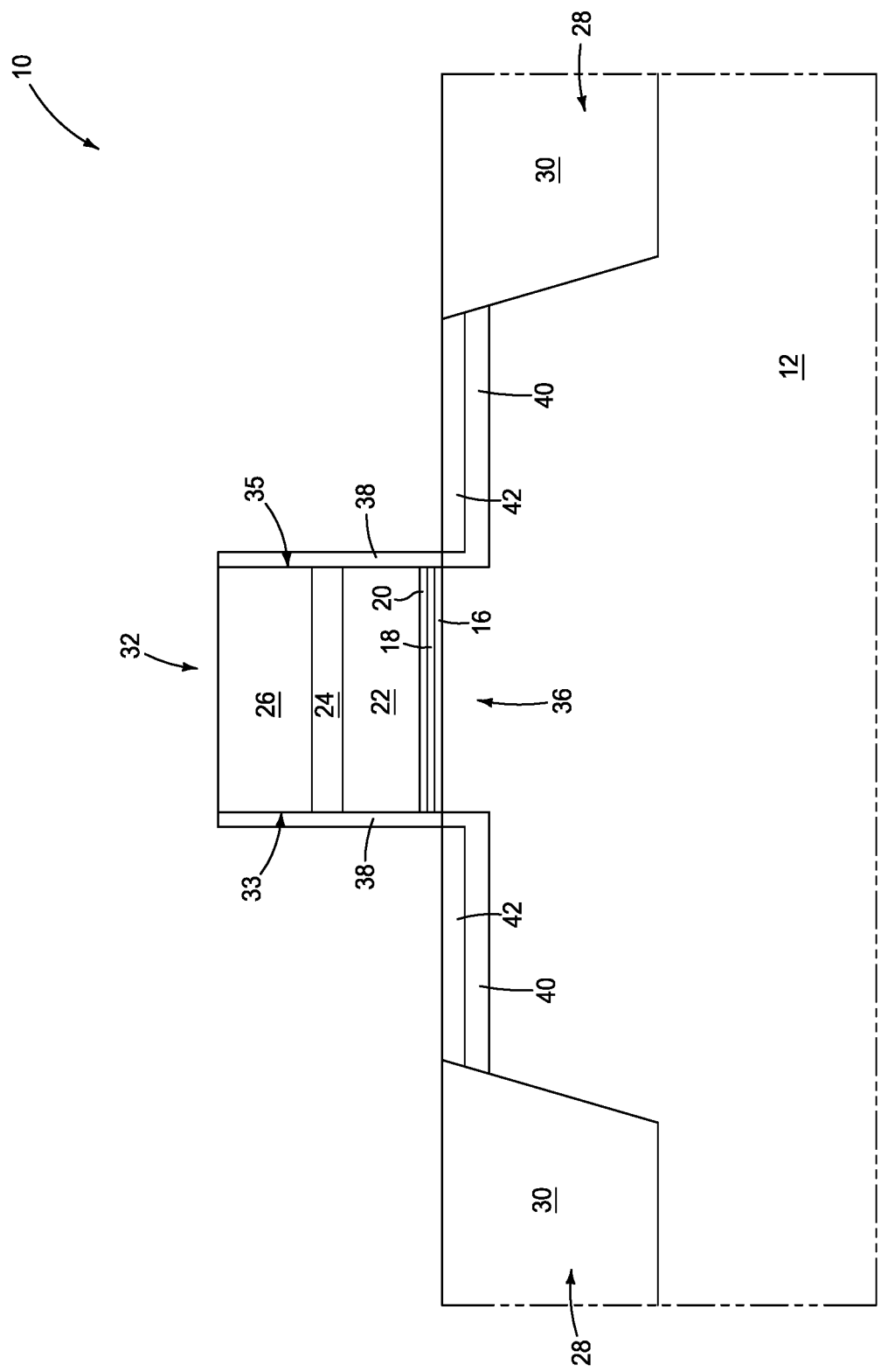

Referring to FIG. 3, insulative material 38 is formed along the sidewalk 33 and 35 of the block 32. The insulative material 38 may comprise any suitable composition(s); and in some embodiments may comprise, consist essentially of, or consist of silicon nitride. The insulative, material 38 extends vertically along the sidewalk 33 and 35, and does not extend horizontally acrosss an upper surface of the base 12. The insulative material 38 may be formed in the shown configuration by any suitable methodology. For instance, the insulative material 38 may be initially formed as a layer which extends conformally across an upper surface of the base 12, an upper surface of the block 32, and the sidewalk 33 and 35; and such layer may be subjected to anisotropic etching to remove the material 38 from over the upper surface of the block 32 and from over upper surfaces of the base 12, while leaving the material 38 along the sidewalls 33 and 35 of the block 32. The insulative material 38 may protect sidewalls of the block 32 (specifically, sidewalk of the conductive materials 20, 22 and 24) during subsequent process stages.

Halo implant regions 40 and LDD implant regions 42 are formed within the base 12 on opposing sides of the channel region 36. The regions 40 and 42 may be formed after formation of the insulative material 38.

The halo implant regions 40 will comprise an opposite-type conductivity-enhancing dopant as compared to the LDD regions 42. Specifically, in some embodiments the halo regions 40 will be p-type while the LDD regions 42 are n-type, and in other embodiments the halo regions will be n-type while the LDD regions are p-type.

The halo regions 40 and LDD regions 42 are generally lightly doped with conductivity-enhancing dopant; and specifically may be doped to concentrations less than or equal to about $10^{19}$ atoms/cm$^3$ with conductivity-enhancing dopant.

The halo regions 40 and MD regions 42 may alleviate short-channel effects.

Figure 4:
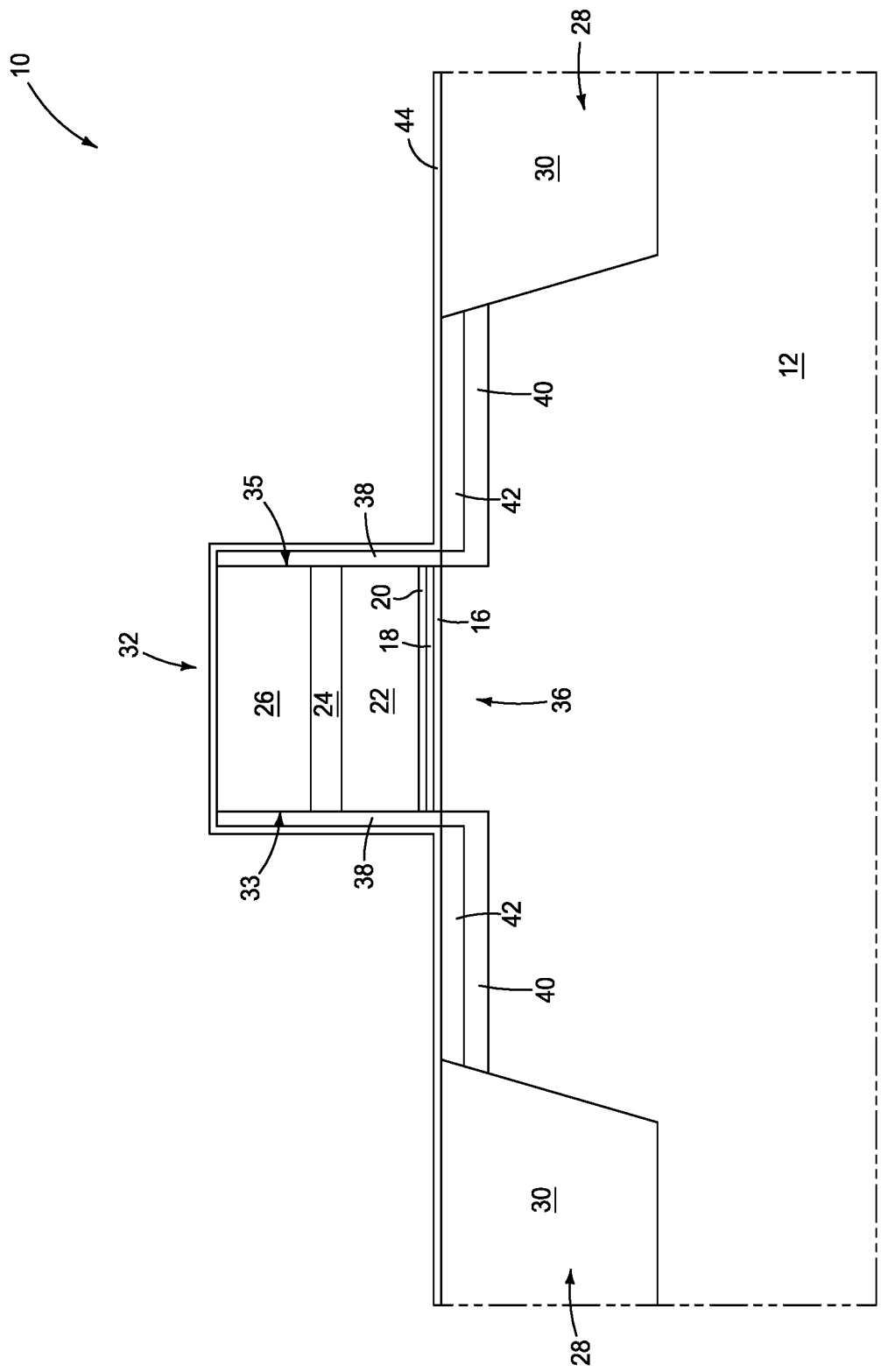

Referring to FIG. 4, a spacer material 44 is formed to extend around the block 32, and along the upper surface of the base 12. The spacer material 44 comprises silicon (Si), boron (B), nitrogen (N) and oxygen (O). The concentration of boron within the material 44 may be within a range of from about 20 atomic percent (at %) to about 30 at %. The ratio of silicon to nitrogen (Si:N) within the spacer material 44 may be within a range of from about 10:1 to about 1:10. The amount of oxygen within the material 44 may be greater than about 1 at %, greater than about 5 at %, greater than about 20 at %, greater than about 25 at %, etc.

The spacer material 44 may be formed by any suitable method. In some embodiments, SiBN is initially deposited utilizing, for example, one or both of ALD and CVD (where the formula SiBN refers to primary constituents rather than to a specific stoichiometry). The SiBN is then subjected to oxidation (asking) to form SiBNO (where the chemical formula SiBNO indicates primary constituents rather than a specific stoichiometry). The ashing may be conducted in a separate chamber than that utilized for the deposition of the SiBN, or may be conducted in the same chamber as that utilized for the deposition of the SiBN. The ashing may convert an entirety of the SiBN to SiBNO, or may convert only a portion of the SiBN to the SiBNO. The oxidation of the spacer material 44 may utilize any suitable conditions; and in some embodiments may utilize an oxygen plasma.

At least some of the SiBNO may be removed at a later process stage, and accordingly may be sacrificial.

Figure 5:
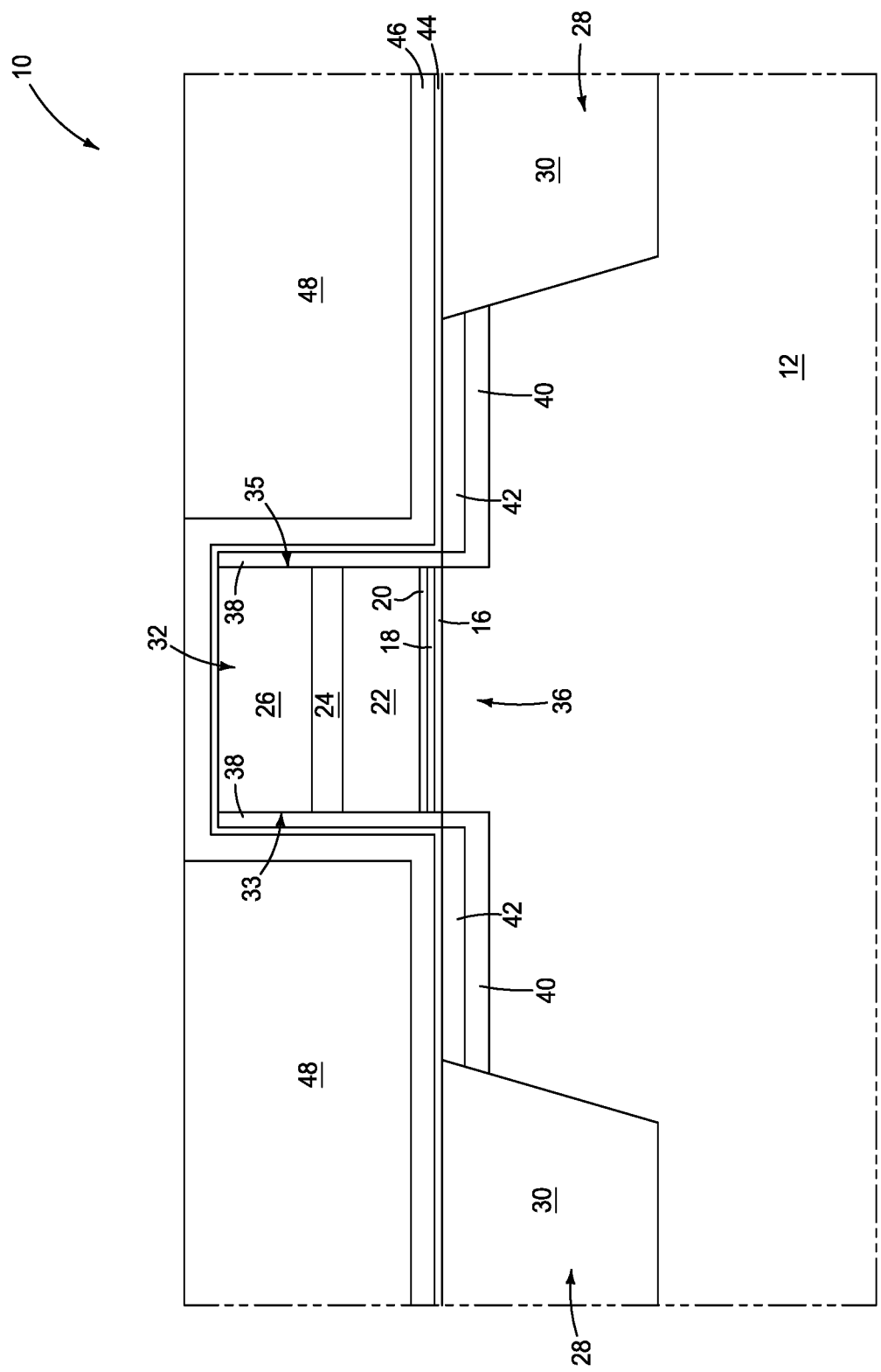

Referring to FIG. 5, another spacer material 46 is provided over the spacer material 44. The spacer material 46 may comprise any suitable composition(s); and in some embodiments may comprise, consist essentially of, or consist of silicon nitride.

In some embodiments, the materials 44 and 46 may be referred to as first and second spacer materials, respectively; with the first spacer material 44 being between the second spacer material 46 and the block 32.

In some embodiments, the materials 44, 46 and 38 may be referred to as first, second and third spacer materials, respectively; with the third spacer material 38 being between the first spacer material 44 and the sidewalls 33 and 35 of the block 32, and with the first spacer material 44 being between the second spacer material 46 and the third spacer material 38. The second and third spacer materials 46 and 38 may comprise a same composition as one another (e.g., both may comprise silicon nitride). Alternatively, the second and third spacer materials 46 and 38 may comprise different compositions relative to one another.

Another spacer material 48 is formed outwardly of the spacer material 46. The spacer material 48 may comprise any suitable composition(s); and in some embodiments may comprise, consist essentially of, or consist of silicon dioxide. In some embodiments, the spacer material 48 may be referred to as a fourth spacer material.

Figure 6:
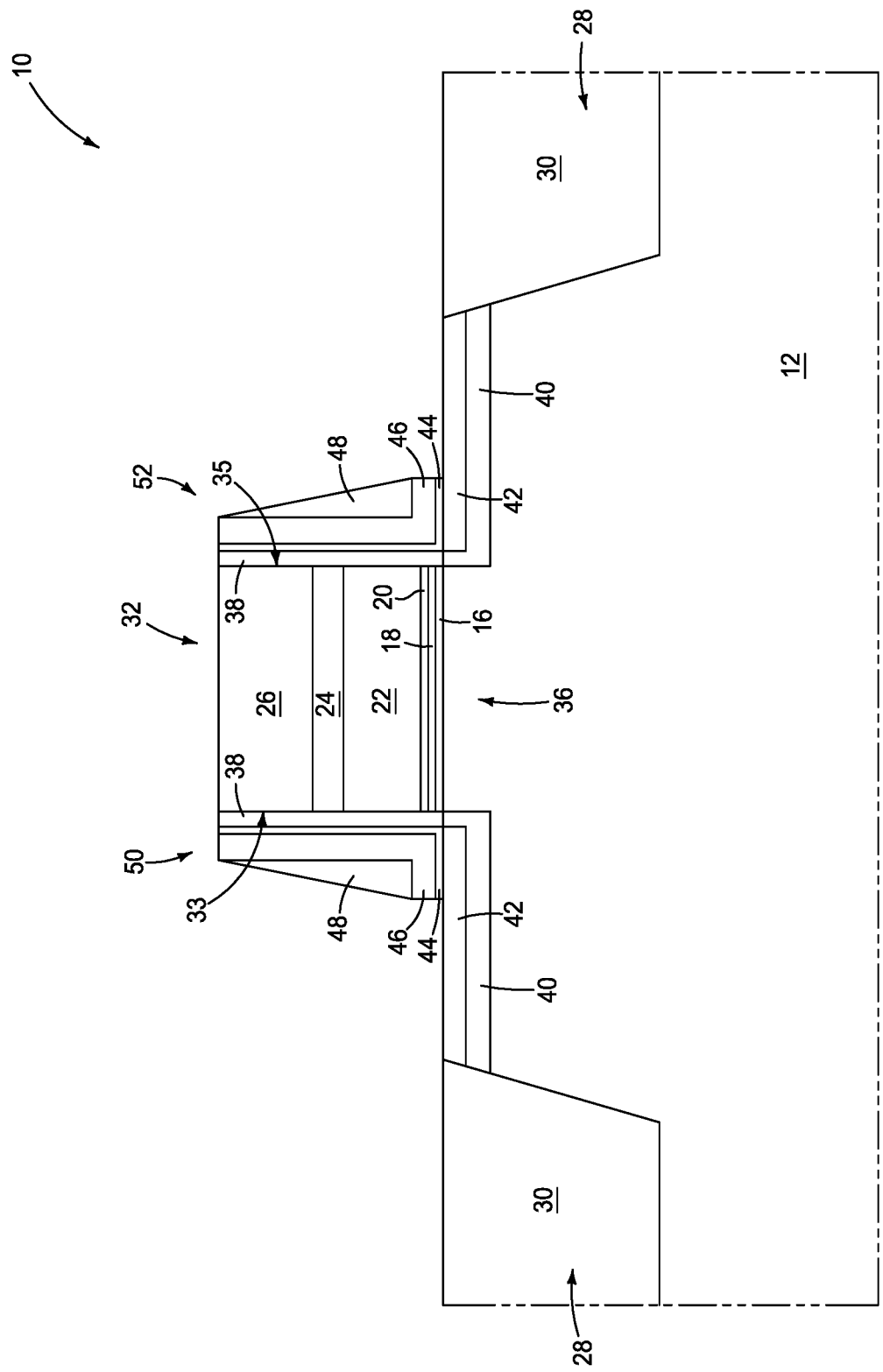

Referring to FIG. 6, the spacer materials 44, 46 and 48 are subjected to anisotropic etching to form sidewall spacers 50 and 52. The sidewall spacers 50 and 52 may be considered to comprise the first, second, third and fourth spacer materials 44, 46, 38 and 48. The sidewall spacers 50 and 52 may be referred to as first and second sidewall spacers (or first and second spacers), respectively.

Figure 7:
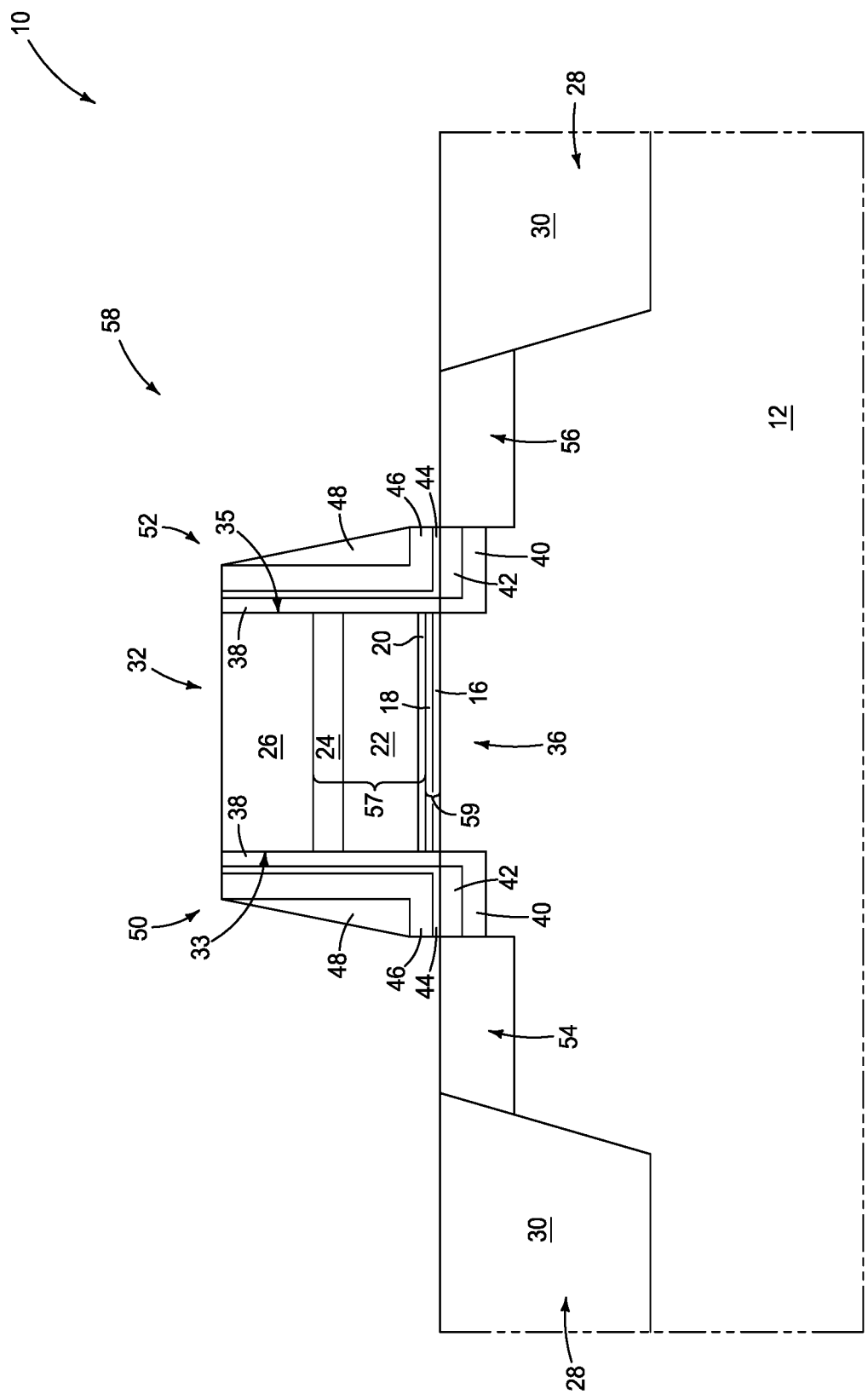

Referring to FIG. 7, source/drain regions 54 and 56 are formed to extend into the base 12 on opposing sides of the channel region 36. The source/drain regions 54 and 56 may be formed by implanting suitable conductivity-enhancing dopant into the base 12 while utilizing the spacers 50 and 52, together with the isolation regions 28 and the block 32, to pattern the location of the source/drain regions. The source/drain regions 54 and 56 may be referred to as first and second source/drain regions, respectively. The first source/drain region 54 is proximate the first sidewall 33 of the block 32 (and accordingly is proximate the first sidewall spacer 50), and the second source/drain region 56 is proximate the second sidewall 35 of the block 32 (and accordingly is proximate the second sidewall spacer 52).

The source/drain regions 54 and 56 may be heavily-doped with suitable conductivity-enhancing dopant (i.e., may be doped to a concentration of at least about $10^{20}$ atoms/cm$^3$ with the conductivity-enhancing dopant). Example conductivity-enhancing dopants include boron, phosphorus, arsenic, etc. The source/drain regions 54 and 56 may be a same conductivity type as the LDD regions 42, and may thus be an opposite conductivity type relative to the halo regions 40.

The assembly 10 of FIG. 7 may be considered to comprise a transistor 58 which includes a gate 57 (the conductive materials 20, 22 and 24) spaced from the channel region 36 by an insulative region 59 (the gate dielectric materials 16 and 18); and which includes the source/drain regions 54 and 56, together with the halo regions 40 and the LDD regions 42. In some embodiments, the transistor 58 may be a p-channel device (also referred to as a PMOS device), and accordingly the source/drain regions 54 and 56 may be p-type. In other embodiments, the transistor 58 may be an n-channel device (also referred to as an NMOS device), and accordingly the source/drain regions 54 and 56 may be n-type.

Figure 8:
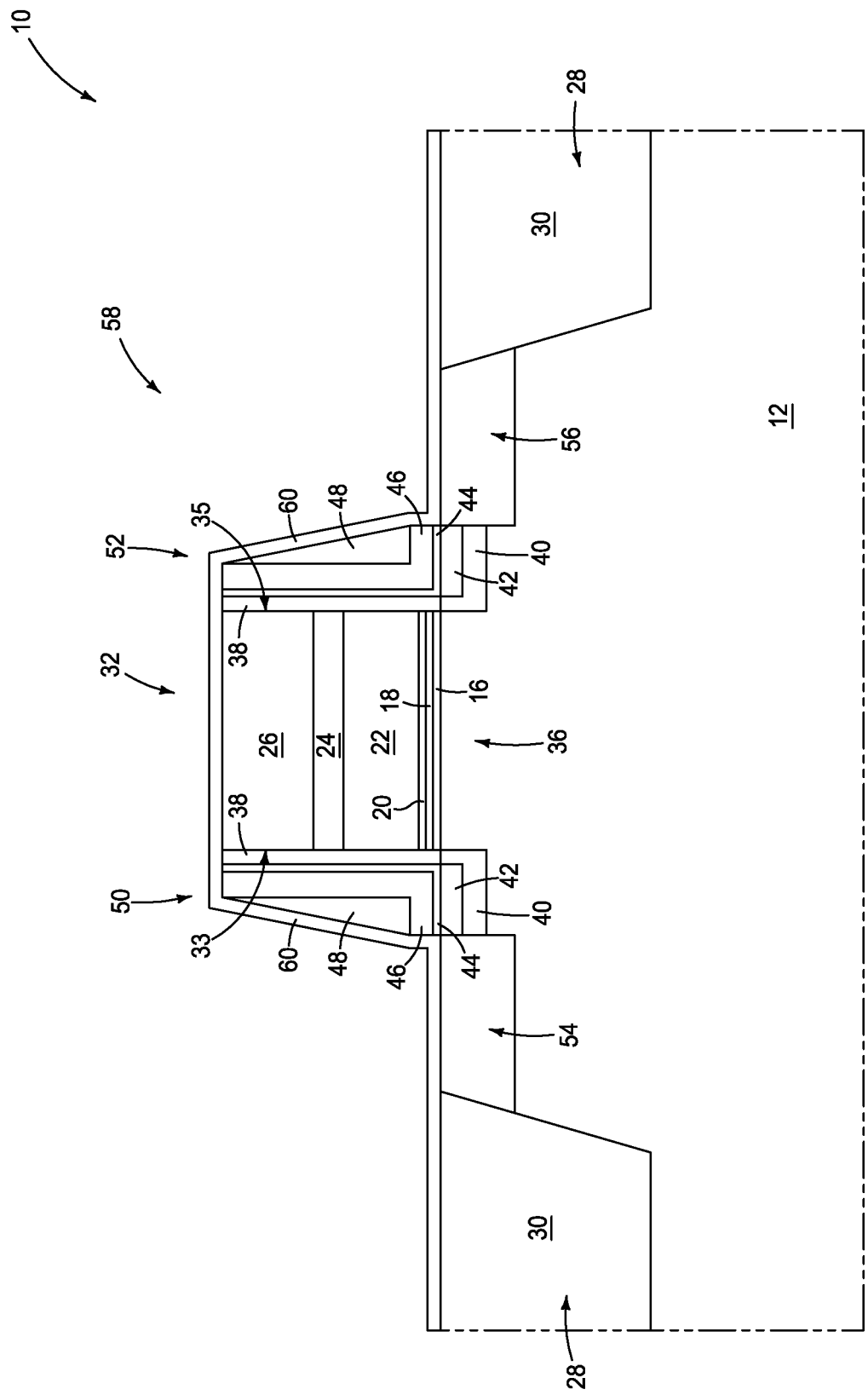

Referring to FIG. 8, an insulative barrier material 60 is formed along the fourth spacer material 48. The insulative barrier material 60 may comprise any suitable composition(s); and in some embodiments may comprise, consist essentially of, or consist of silicon nitride. The insulative barrier material 60 may be formed with any suitable processing. In some embodiments, a layer of the material 60 may be deposited utilizing one or both of ALD and CVD to form the configuration of FIG. 8.

Figure 9:
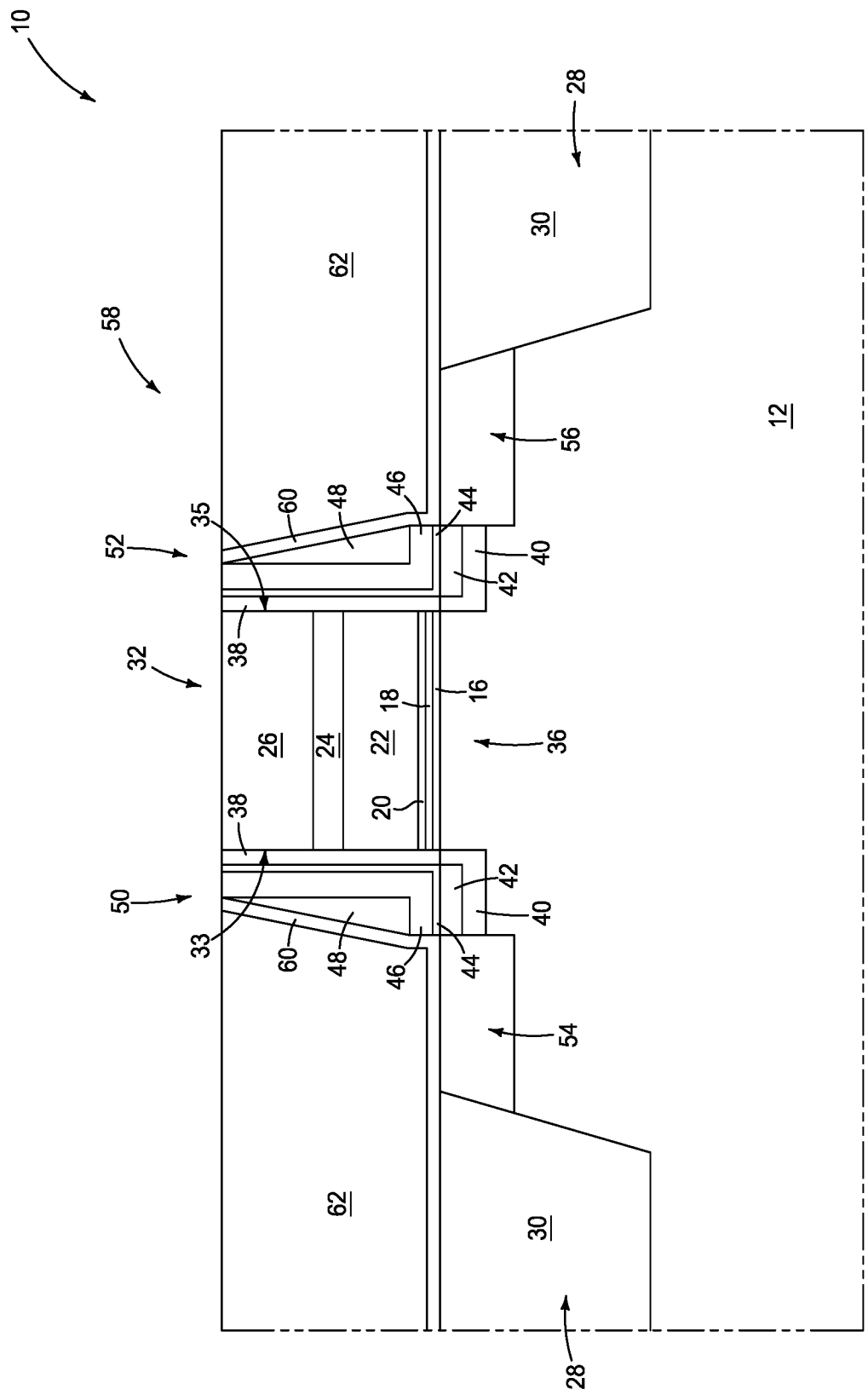

Referring to FIG. 9, an insulative mass 62 is formed over the first and second source/drain regions 54 and 56. In the illustrated embodiment, the insulative mass 62 is laterally adjacent the sidewall spacers 50 and 52. The insulative mass 62 may comprise any suitable composition(s); and in some embodiments may comprise, consist essentially of, or consist of silicon dioxide. The insulative mass 62 may be formed in the illustrated configuration utilizing any suitable processing, and in some embodiments may be formed utilizing spin-on deposition (SOD) with subsequent planarization, chemical-mechanical polishing, CMP) to form the configuration of FIG. 9.

Figure 10:
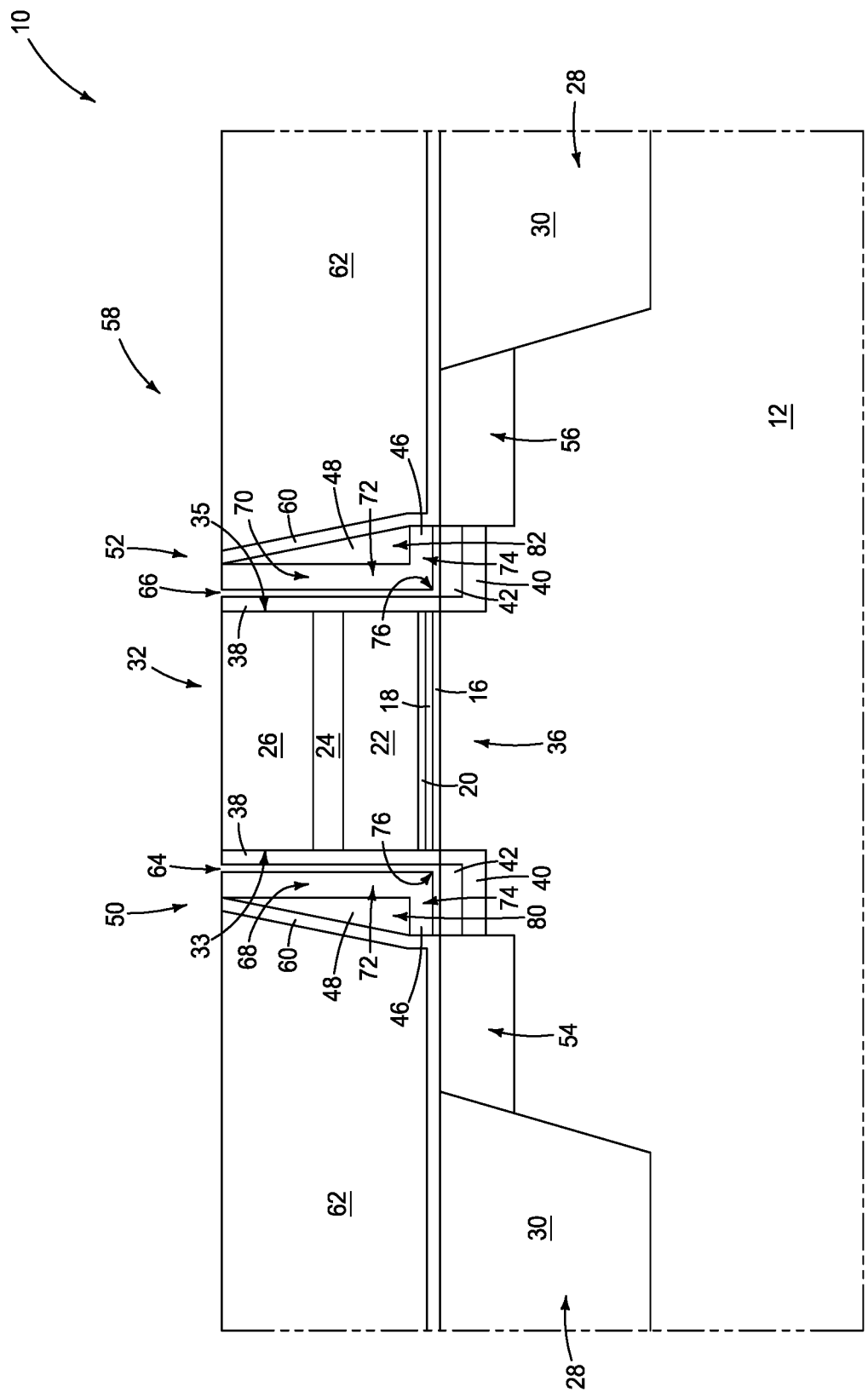

Referring to FIG. 10, the spacer material 44 (FIG. 9) is removed to leave voids 64 and 66 within the sidewall spacers 50 and 52, respectively. The voids 64 and 66 may be referred to as first and second voids, respectively.

The spacer material 44 may be removed with any suitable processing. In some embodiments, the spacer material 44 (the oxidized SiBN; or, in other words, the SiBNO) may be selectively removed relative to silicon nitride with wet etching utilizing dilute hydrofluoric acid (DHF), a combination of sulfuric acid and hydrogen peroxide (a so-called sulfuric/peroxide mix, SPM), a buffered hydrofluoric acid (also referred to as a buffered oxide etch, BOE), etc. Example BOE compositions are available in the industry as LAL 30, LAL 800, etc. In some example embodiments, the wet etching may be conducted for a duration of from about 35 seconds to about 50 seconds. In some example embodiments, the DHF may comprise a ratio of commercially available hydrofluoric acid to water (HF:water) of from about 1:100 to about 1:500; where commercially available hydrofluoric acid may comprise an HF concentration within a range of from about 10% to about 49% in water (with the percentages referring to weight concentration, w/w %).

For purposes of interpreting this disclosure, etching conditions are considered to be selective for a first material relative to a second material if the etching conditions remove the first material faster than the second material, which can include, but is not limited to, etching conditions which are 100% selective for the first material relative to the second material.

In some embodiments, the SiBN may be only partially oxidized, and one or more of the above-described etchants (particularly the BOE and the DHF) may be utilized to selectively remove the oxidized SiBN relative to the non-oxidized SiBN.

Figure 10A:
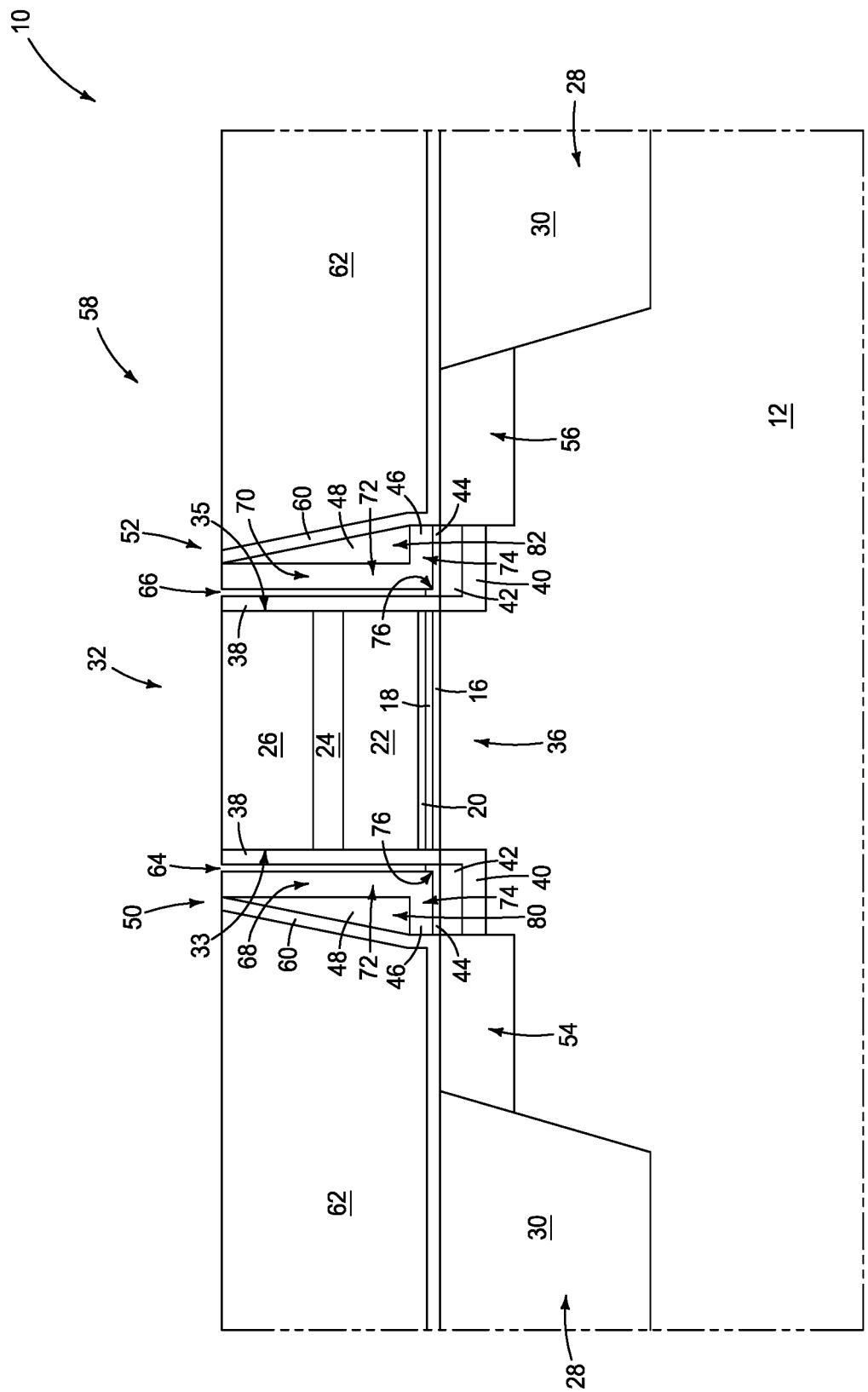
FIGS. 10A, 10B and 10C are diagrammatic cross-sectional views of the region of the integrated assembly of FIGS. 1-10 shown at example process stages which may be alternative to the process stage shown in FIG. 10.

In the illustrated embodiment of FIG. 10, an entirety of the spacer material 44 (FIG. 9) is removed. In other embodiments, only some of the material 44 may be removed while leaving remaining portions of the material 44 within the spacers 50 and 52. For instance, FIGS. 10A and 10B illustrate example embodiments in which only some of the spacer material 44 is removed.

Figure 10B:
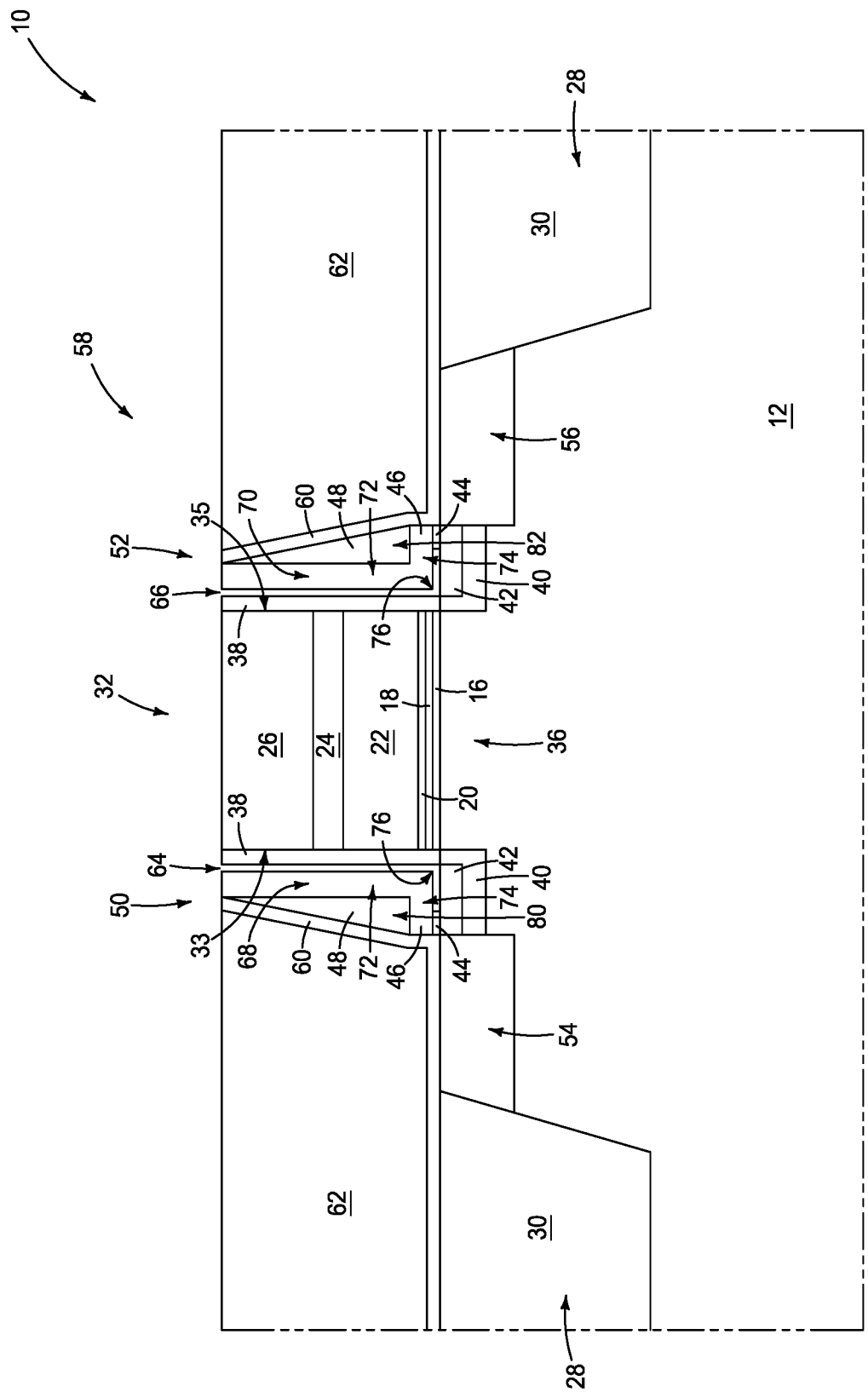

In some embodiments, the first and second spacers 50 and 52 of FIGS. 10-10B may be considered to include first and second spacer structures 68 and 70, respectively; with such first and second spacer structures comprising the spacer material 46. The first spacer 50 comprises the first void 64 between the first spacer structure 68 and the first sidewall 33 of the block 32; and the second spacer 52 comprises the second void 66 between the second spacer structure 70 and the second sidewall 35 of the block 32. As indicated above, the block 32 comprises a transistor gate 57 (labeled in FIG. 7) comprising the conductive materials 20, 22 and 24. Accordingly, the voids 64 and 66 may be considered to be between the spacer structures 68, 70, and the sidewalls 33,35 of the transistor gate.

In some embodiments, the spacer material 48 may be considered to be configured as third and fourth spacer structures 80 and 82 which are directly adjacent to the first and second spacer structures 68 and 70, respectively.

In some embodiments, the spacer material 46 of the spacer structures 68 and 70 may be considered to include vertical segments 72 and horizontal segments 74, with the vertical segments extending upwardly from the horizontal segments. The vertical segments 72 join to the horizontal segments 74 at corners 76. The embodiment of FIG. 10 has the voids 64 and 66 extending along the vertical segments 72, around the corners 76, and along the horizontal segments 74. The embodiment of FIG. 10A has the voids 64 and 66 extending along portions of the vertical segments 72, and not around the corners 76 or along the horizontal segments 74. The embodiment of FIG. 10B has the voids 64 and 66 extending along the vertical segments 72, around the corners 76, and only partially along the horizontal segments 74. The embodiments of FIGS. 10A and 10B may be considered to comprise fill material corresponding to remaining portions of the material 44, with the fill material being along bottoms of the voids 64 and 66. The fill material 44 may comprise silicon, nitrogen and boron; and in some embodiments may comprise silicon, nitrogen, boron and oxygen.

Figure 10C:
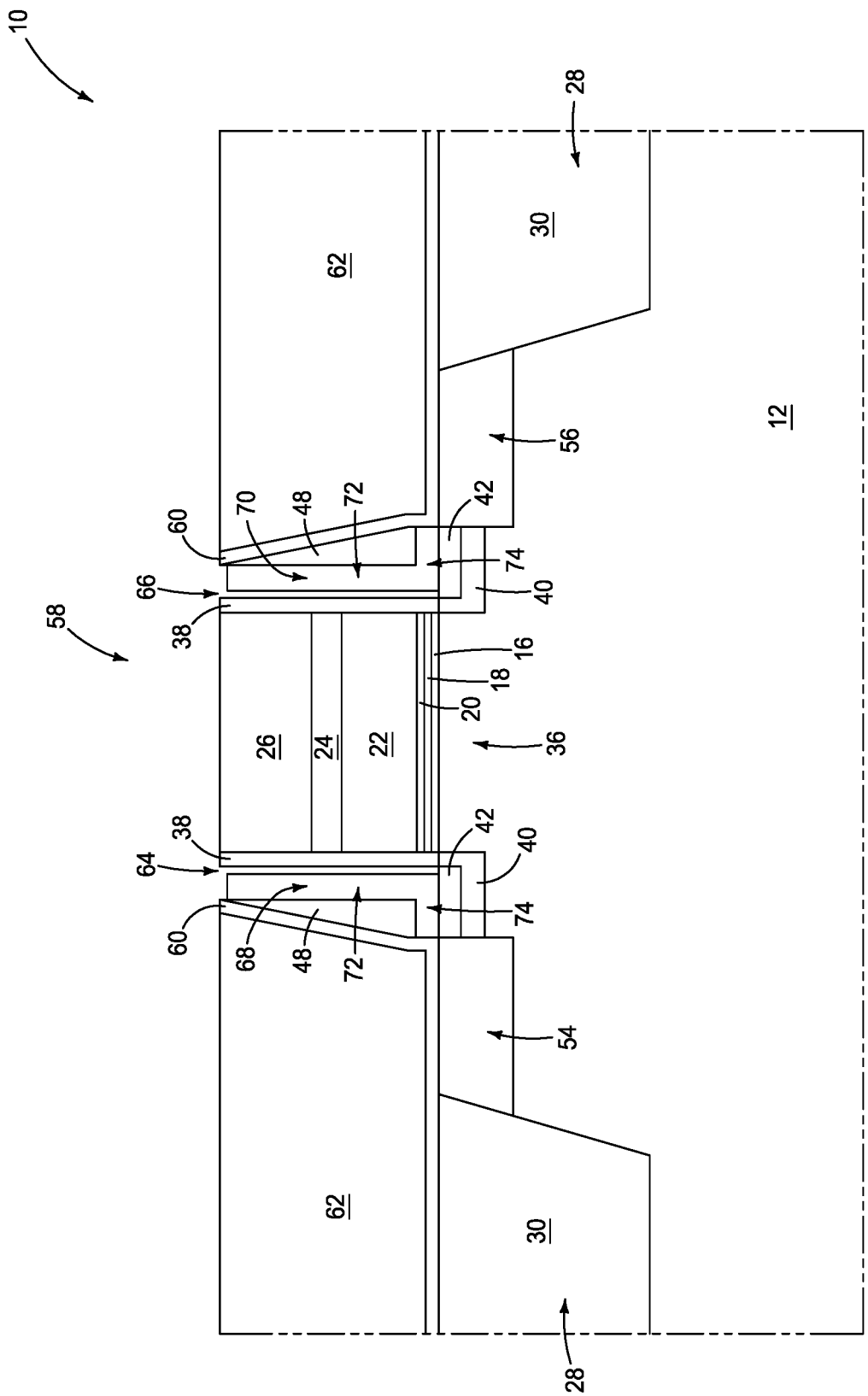

In some embodiments, it may be advantageous for a portion of the fill material 44 to remain along the horizontal segments 74 to support the spacer structures 68 and 70. For instance, FIG. 10C shows a structure which may result if there is no supporting fill material under the structures 68 and 70. The structures 68 and 70 have collapsed (fallen) down to the base 12. The configuration of FIG. 10C may be utilized provided that the collapse of the structures 68 and 70 does not detrimentally influence performance of the transistor 58. Alternatively, embodiments analogous to those of FIGS. 10A and 10B (i.e., embodiments having the fill material 44 along the horizontal regions 74 of the spacer structures 68 and 70) may be utilized to avoid the collapse of the structures 68 and 70.

Figure 11:
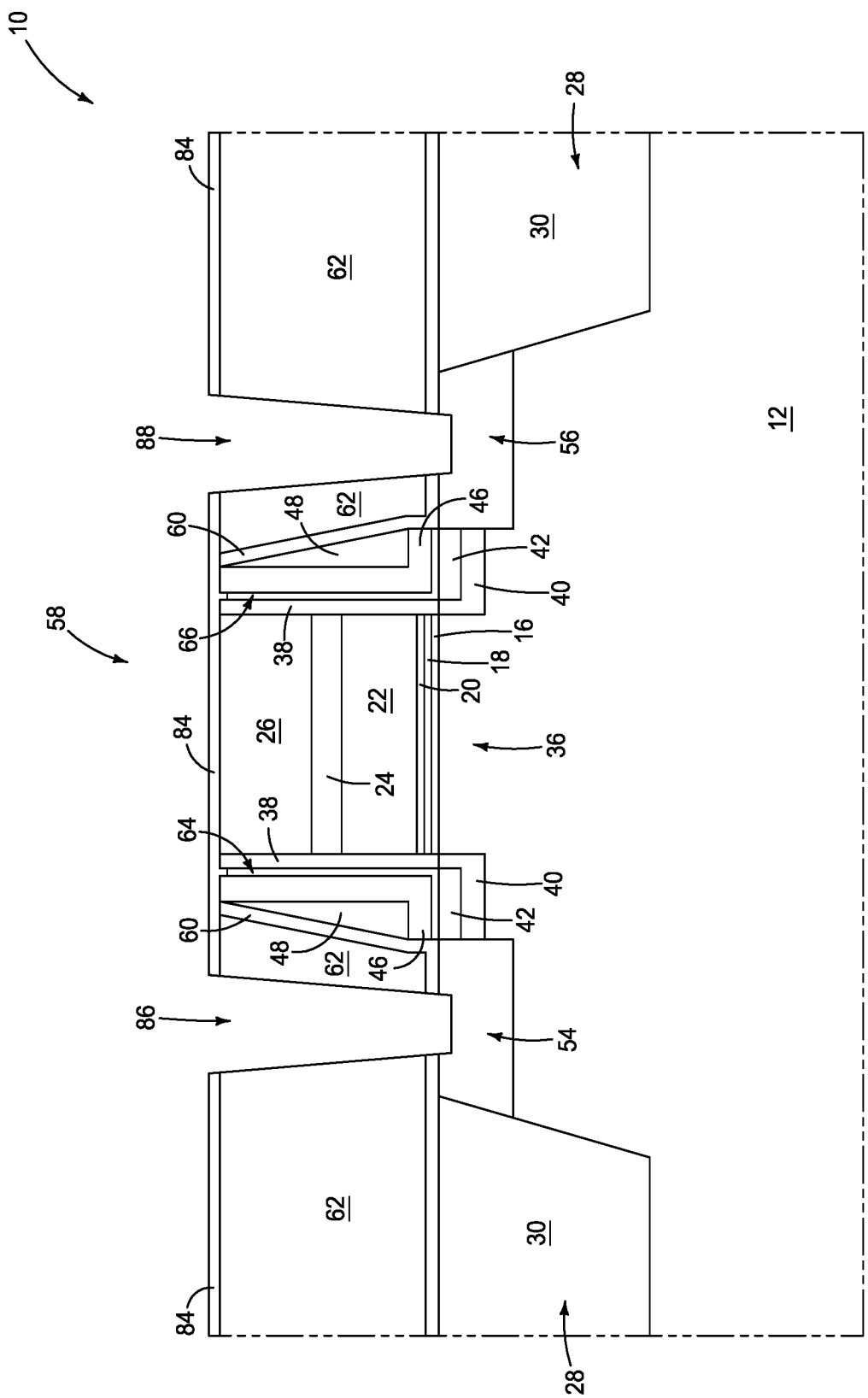
FIGS. 11-13 are diagrammatic cross-sectional views of the region of the integrated assembly of FIGS. 1-10 shown at example sequential process stages which may follow the process stage of FIG. 10.

Referring to FIG. 11, a protective material 84 is formed over the insulative mass 62, and across the voids 64 and 66. The protective material 84 caps the voids 64 and 66, and in some embodiments may be referred to as a capping material. The protective material 84 may comprise any suitable composition(s); and in some embodiments may comprise, consist essentially of, or consist of silicon nitride.

Openings 86 and 88 are formed to extend through the materials 62 and 84, with such openings extending to the source/drain regions 54 and 56. The openings 86 and 88 may be referred to as first and second openings, respectively. In the illustrated embodiment, the openings 86 and 88 penetrate into the source/drain regions 54 and 56. In other embodiments, the openings 86 and 88 may extend to upper surfaces of the source/drain regions 54 and 56 without penetrating into such source/drain regions.

The openings 86 and 88 may be formed with any suitable processing. For instance, in some embodiments the openings 86 and 88 may be formed utilizing a photolithographically-patterned photoresist mask (not shown) to define locations of the openings, one or more suitable etches to extend the openings through the materials 62 and 84 and into the source/drain regions 54 and 56, and subsequent removal of the mask to leave the shown configuration of FIG. 11.

Figure 12:
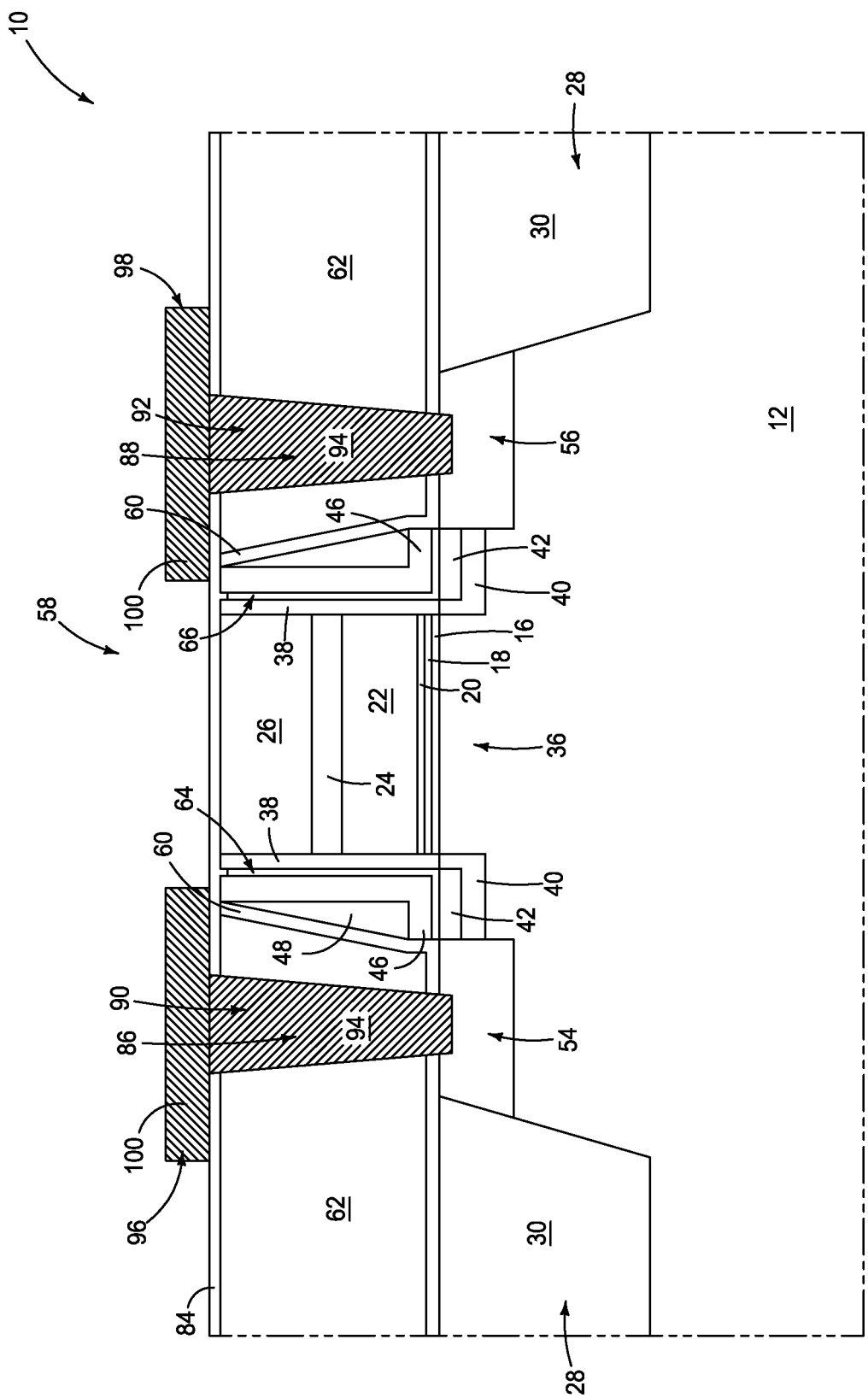

Referring to FIG. 12, first and second conductive contacts 90 and 92 are formed within the first and second openings 86 and 88, respectively; and are electrically coupled with the first and second source/drain regions 54 and 56, respectively. The contacts 90 and 92 comprise conductive material 94. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the shown embodiment, conductive pads 96 and 98 are formed over the contacts 90 and 92, and in electrical connection with the contacts 90 and 92. The conductive pads 96 and 98 comprise a conductive material 100. The conductive material 100 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 94 and 100 may comprise a same composition as one another, or may comprise different compositions relative to one another. In some embodiments, the conductive pads 96 and 98 may be omitted.

Figure 13:
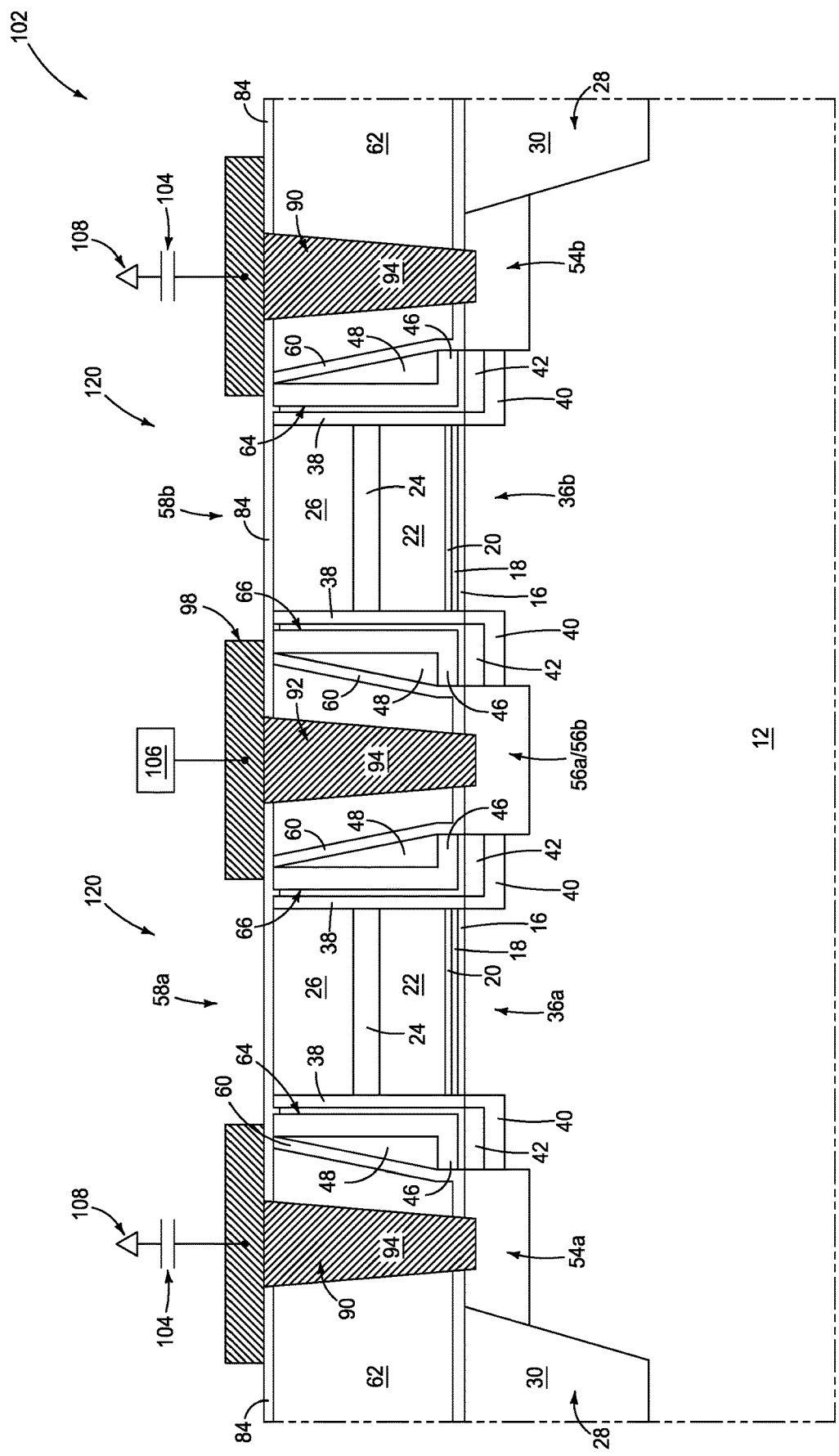

In some embodiments, the transistor 58 may be incorporated into memory (e.g., DRAM) as an access device. FIG. 13 shows a region of a memory array 102 comprising a pair of transistors 58 as access devices. The transistors are labeled as 58a and 58b so that they may be distinguished from one another. The transistors comprise source/drain regions 54 and 56; with the source/drain regions of the transistor 58a being labeled 54a and 56a, and with the source/drain regions of the transistor 58b being labeled 54b and 56b. Notably, in the shown embodiment the transistor regions 56a and 56b are comprised by a region 56a/56b which is shared between the transistors 58a and 58b. The transistor 58a comprises a channel region 36a, and the transistor 58b comprises a channel region 36b.

The interconnects 90 of the transistors 58a and 58b are electrically coupled with capacitors 104, and the interconnect 92 is electrically coupled with a bitline (digit line) 106.

The capacitors 104 have nodes electrically coupled to a reference voltage 108. Such reference voltage may be any suitable voltage; such as, for example, ground, VCC/2, etc.

In operation, the transistor 58a may be an access device which may selectively couple the bitline 106 with one of the capacitors 104 through the channel region 36a when suitable voltage is applied to a gate of the transistor; and similarly the transistor 58b may be an access device which may selectively couple the bitline 106 with the other of the capacitors 104 through the channel region 36b when suitable voltage is applied to the gate of the transistor. The access devices 58a, 58b and associated capacitors 104 may be considered to be comprised by memory cells 120.

Figure 14:
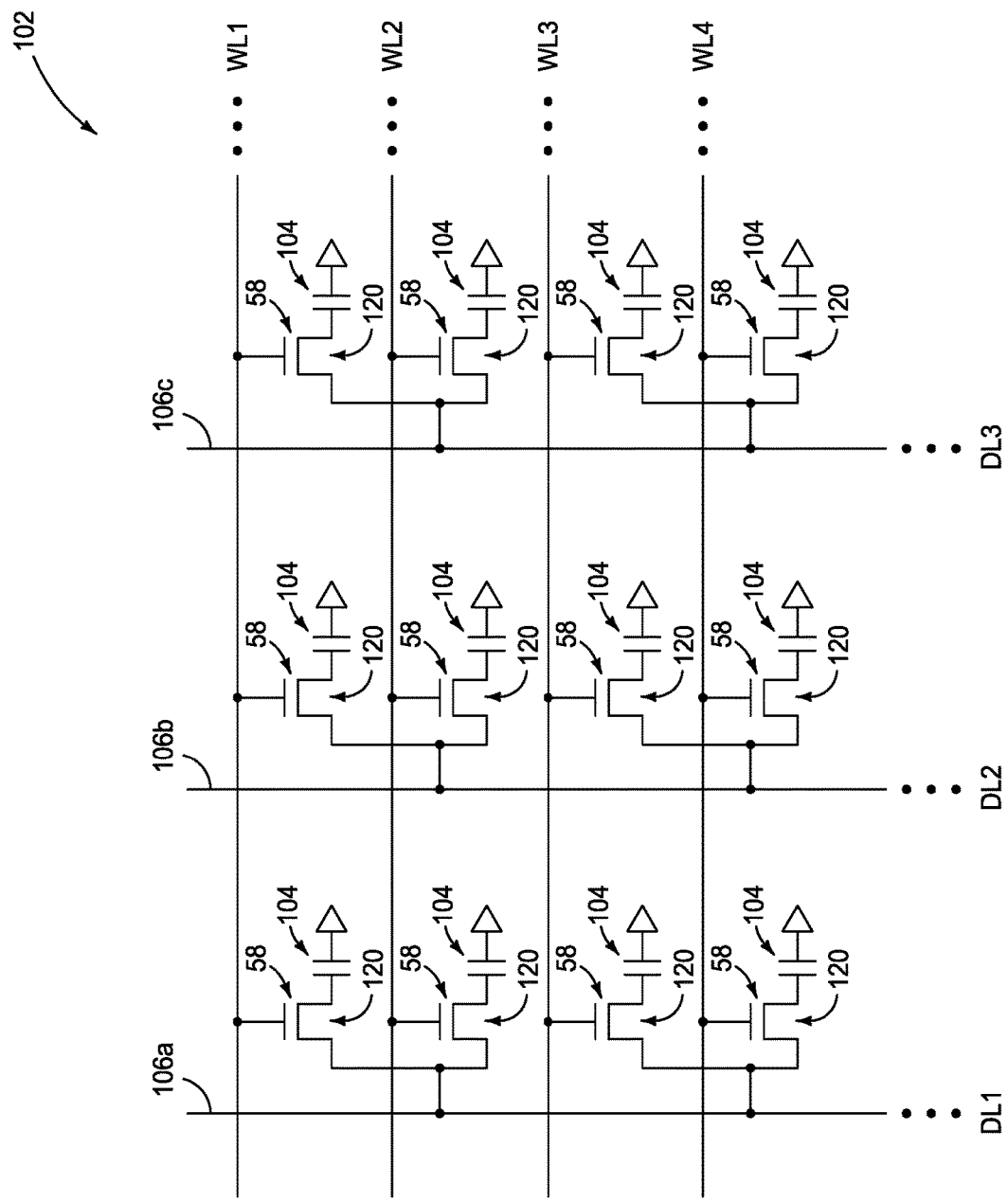
FIG. 14 is diagrammatic schematic view of a region of an example memory array.

The transistors 58a and 58b may be examples of numerous substantially identical access devices which may be utilized within a memory array, with the term "substantially identical" meaning identical to within reasonable tolerances of fabrication and measurement. FIG. 14 schematically illustrates a region of the example memory array 102 comprising a plurality of the memory cells 120. Each of the individual memory cells includes an access device 58 and a capacitor 104. The access devices 58 are electrically coupled with wordlines (WL1-WL4). Bitlines (digit lines) 106a-c (also labeled as DL1-DL3) are electrically coupled with source/drain regions of the access devices 58. Each of the memory cells 120 is uniquely addressed through a combination of one of the digit lines and one of the wordlines. The memory cells 120 may be substantially identical to one another, and the memory array 102 may comprise any suitable number of the memory cells. In some embodiments, the memory array may comprise hundreds, thousands, millions, hundreds of millions, etc., of the memory cells.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming a transistor. One or more gate dielectric materials are formed over a semiconductor base. One or more gate materials are formed over the one or more gate dielectric materials. The one or more gate materials are patterned into a gate material block. The gate material block has a pair of opposing sidewalls along a cross-section. The sidewalls are a first sidewall and a second sidewall. A transistor channel region is within the semiconductor base and is directly under the gate material block. First and second spacers are formed along the first and second sidewalls, respectively. The first and second spacers each comprise a first spacer material adjacent a second spacer material. The first spacer material comprises silicon, boron and nitrogen, and is between the second spacer material and the gate material block. First and second source/drain regions are formed within the semiconductor base and adjacent to the transistor channel region. The first source/drain region is proximate to the first sidewall, and the second source/drain region is proximate to the second sidewall. After the first and second source/drain regions are formed, at least some of the first spacer material is removed to leave first and second voids within the first and second spacers, respectively.

Some embodiments include a transistor having a transistor gate over a semiconductor base and spaced from the semiconductor base by gate dielectric material. The transistor gate has a pair of opposing sidewalls along a cross-section. The opposing sidewalls are a first sidewall and a second sidewall. A transistor channel region is within the semiconductor base and is directly under the transistor gate. First and second spacers are along the first and second sidewalls, respectively. The first and second spacers each include a spacer structure and a void between the spacer structure and the transistor gate. The void within the first spacer is a first void, and the void within the second spacer is a second void. The spacer structure within the first spacer is a first spacer structure, and the spacer structure within the second spacer is a second spacer structure. The first and second spacer structures each include a vertical segment extending upwardly from a horizontal segment. The vertical segments join to the horizontal segments at corners. The first and second voids are along the entirety of the vertical segments of the first and second spacer structures, and extend around the corners and to under the horizontal segments of the first and second spacer structures. First and second source/drain regions are within the semiconductor base and on opposing sides of the transistor channel region relative to one another. The first source/drain region is proximate to the first sidewall, and the second source/drain region is proximate the second sidewall.

Some embodiments include a transistor having a transistor gate over a semiconductor base, and spaced from the semiconductor base by gate dielectric material. The transistor gate has a pair of opposing sidewalk along a cross-section. The opposing sidewalls are a first sidewall and a second sidewall. A transistor channel region is within the semiconductor base and is directly under the transistor gate. First and second spacers are along the first and second sidewalls, respectively. The first and second spacers each comprise a spacer structure and a void between the spacer structure and the transistor gate. The void within the first spacer is a first void, and the void within the second spacer is a second void. The spacer structure within the first spacer is a first spacer structure, and the spacer structure within the second spacer is a second spacer structure. Bottoms of the first and second voids are along a fill material comprising silicon, nitrogen and boron. First and second source/drain regions are within the semiconductor base and are on opposing sides of the transistor channel region relative to one another. The first source/drain region is proximate to the first sidewall, and the second source/drain region is proximate to the second sidewall.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a transistor, comprising:
   forming one or more gate dielectric materials over a semiconductor base;
   forming one or more gate materials over the one or more gate dielectric materials;
   patterning the one or more gate materials into a gate material block; the gate material block having a pair of opposing sidewalls along a cross-section; the sidewalls being a first sidewall and a second sidewall; a transistor channel region being within the semiconductor base and directly under the gate material block;
   forming first and second spacers along the first and second sidewalls, respectively; the first and second spacers each comprising a first spacer material adjacent a second spacer material; the first spacer material comprising silicon, boron and nitrogen, and being between the second spacer material and the gate material block;
   forming first and second source/drain regions within the semiconductor base and adjacent the transistor channel region; the first source/drain region being proximate the first sidewall and the second source/drain region being proximate the second sidewall; and
   after forming the first and second source/drain regions, removing at least some of the first spacer material to leave first and second voids within the first and second spacers, respectively.

2. The method of claim 1 further comprising forming halo regions and/or LDD regions adjacent the transistor channel region prior to forming the first and second spacers.

3. The method of claim 1 wherein an entirety of the first spacer material is removed.

4. The method of claim 1 wherein only a portion of the first spacer material is removed.

5. The method of claim 1 wherein the first spacer material includes oxygen.

6. The method of claim 5 wherein the first spacer material is formed by depositing an initial material comprising silicon, boron and nitrogen, and then oxidizing the initial material to form the first spacer material to include the silicon, nitrogen, boron and oxygen.

7. The method of claim 5 wherein a concentration of the boron within the first spacer material is within a range of from about 20 atomic percent to about 30 atomic percent.

8. The method of claim 1 wherein the first and second spacers comprise a third material between the first spacer material and the gate material block.

9. The method of claim 8 wherein the second and third spacer materials comprise a same composition as one another.

10. The method of claim 9 wherein the second and third spacer materials comprise silicon nitride.

11. The method of claim 8 wherein the second and third spacer materials comprise different compositions relative to one another.

12. The method of claim 8 wherein the first and second spacers comprise a fourth spacer material adjacent the second spacer material.

13. The method of claim 12 wherein the second spacer material comprises silicon nitride, and wherein the fourth spacer material comprises silicon dioxide.

14. The method of claim 1 further comprising:
    forming an insulative mass over the first and second source/drain regions and laterally adjacent to the first and second spacers; and
    forming a protective material over the insulative mass and over the first and second spacers; the protective material capping the first and second voids.

15. The method of claim 14 wherein the insulative mass comprises silicon dioxide, and wherein the protective material comprises silicon nitride.

16. The method of claim 15 wherein the first and second spacers comprise a fourth spacer material adjacent the second spacer material; wherein the second spacer material comprises silicon nitride; wherein the fourth spacer material comprises silicon dioxide; and further comprising:
    forming insulative barriers to be between the insulative mass and the fourth spacer material.

17. The method of claim 16 wherein the insulative barriers comprise silicon nitride.

18. The method of claim 14 further comprising:
    forming first and second openings to extend through the protective material and the insulative mass; the first opening extending to the first source/drain region, and the second opening extending to the second source/drain region; and
    first and second conductive contacts within the first and second openings, respectively, and coupled with the first and second source/drain regions, respectively.

19. The method of claim 1 wherein the first spacer material further comprises oxygen with the silicon, boron and nitrogen.

20. A transistor, comprising:
    a transistor gate over a semiconductor base and spaced from the semiconductor base by gate dielectric material; the transistor gate having a pair of opposing sidewalls along a cross-section; the opposing sidewalls being a first sidewall and a second sidewall; a transistor channel region being within the semiconductor base and directly under the transistor gate;
    first and second spacers along the first and second sidewalls, respectively; the first and second spacers each comprising a spacer structure and a void between the spacer structure and the transistor gate; the void within the first spacer being a first void, and the void within the second spacer being a second void; the spacer structure within the first spacer being a first spacer structure, and the spacer structure within the second spacer being a second spacer structure; the first and second spacer structures each comprising a vertical segment extending upwardly from a horizontal segment, with the vertical segments joining to the horizontal segments at corners; the first and second voids being along the entirety of the vertical segments of the first and second spacer structures, and extending around the corners and to under the horizontal segments of the first and second spacer structures; and first and second source/drain regions within the semiconductor base and on opposing sides of the transistor channel region relative to one another; the first source/drain region being proximate the first sidewall and the second source/drain region being proximate the second sidewall.

21. The transistor of claim 20 wherein the first and second voids extend along an entirety of the horizontal segments of the first and second spacer structures.

22. The transistor of claim 20 wherein the first and second voids extend along portions of the horizontal segments of the first and second spacer structures, and wherein a fill material comprising silicon, nitrogen and boron is under remaining portions of the horizontal segments of the first and second spacer structures.

23. The transistor of claim 22 wherein the fill material comprises oxygen.

24. The transistor of claim 22 wherein the first and second spacer structures consist essentially of silicon nitride.

25. The transistor of claim 24 wherein third and fourth spacer structures are directly adjacent to the first and second spacer structures, respectively; and wherein the third and fourth spacer structures consist essentially of silicon dioxide.

26. The transistor of claim 20 being one of a plurality of substantially identical access devices of a memory array.

27. The transistor of claim 20 wherein a portion of the first and second voids have fill material comprising oxygen and boron.

28. The transistor of claim 27 wherein the fill material further comprises nitrogen.

29. A transistor, comprising:
a transistor gate over a semiconductor base, and spaced from the semiconductor base by gate dielectric material; the transistor gate having a pair of opposing sidewalls along a cross-section; the opposing sidewalls being a first sidewall and a second sidewall; a transistor channel region being within the semiconductor base and directly under the transistor gate;

first and second spacers along the first and second sidewalls, respectively; the first and second spacers each comprising a spacer structure and a void between the spacer structure and the transistor gate; the void within the first spacer being a first void, and the void within the second spacer being a second void; the spacer structure within the first spacer being a first spacer structure, and the spacer structure within the second spacer being a second spacer structure; bottoms of the first and second voids being along a fill material comprising silicon, nitrogen and boron; and first and second source/drain regions within the semiconductor base and on opposing sides of the transistor channel region relative to one another; the first source/drain region being proximate the first sidewall and the second source/drain region being proximate the second sidewall.

30. The transistor of claim 29 comprising a capping material over the voids.

31. The transistor of claim 30 wherein the capping material comprises silicon nitride.

32. The transistor of claim 29 wherein the first and second spacer structures comprise silicon nitride.

33. The transistor of claim 29 wherein the fill material comprises oxygen.

34. The transistor of claim 29 wherein the first and second spacer structures are each configured to comprise a vertical segment extending upwardly from a horizontal segment, with the vertical segments joining to the horizontal segments at corners.

35. The transistor of claim 34 wherein the first and second voids are along the vertical segments of the first and second spacer structures; and wherein the first and second voids extend around the corners and to under the horizontal segments of the first and second spacer structures.

36. The transistor of claim 34 wherein the first and second voids are along the vertical segments of the first and second spacer structures and do not extend to under the horizontal segments of the first and second spacer structures.

37. The transistor of claim 29 being one of a plurality of substantially identical access devices of a memory array.

38. The transistor of claim 29 wherein the fill material further comprises oxygen.

* * * * *